(12) United States Patent
Hsieh et al.

(10) Patent No.: US 11,705,498 B2
(45) Date of Patent: Jul. 18, 2023

(54) NANOWIRE TRANSISTOR AND METHOD FOR FABRICATING THE SAME

(71) Applicant: UNITED MICROELECTRONICS CORP., Hsin-Chu (TW)

(72) Inventors: Po-Kuang Hsieh, Kaohsiung (TW); Shih-Hung Tsai, Tainan (TW); Ching-Wen Hung, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 83 days.

(21) Appl. No.: 17/185,985

(22) Filed: Feb. 26, 2021

(65) Prior Publication Data

US 2022/0238677 A1 Jul. 28, 2022

(30) Foreign Application Priority Data

Jan. 26, 2021 (CN) .......................... 202110101854.9

(51) Int. Cl.
| | | |
|---|---|---|
| H01L 29/423 | (2006.01) | |
| H01L 29/06 | (2006.01) | |
| H01L 29/786 | (2006.01) | |
| H01L 29/16 | (2006.01) | |
| H01L 29/45 | (2006.01) | |
| H01L 29/66 | (2006.01) | |

(52) U.S. Cl.
CPC .... *H01L 29/42392* (2013.01); *H01L 29/0673* (2013.01); *H01L 29/1606* (2013.01); *H01L 29/45* (2013.01); *H01L 29/66045* (2013.01); *H01L 29/78696* (2013.01)

(58) Field of Classification Search
CPC .......... H01L 29/42392; H01L 29/0673; H01L 29/1606; H01L 29/45; H01L 29/66045; H01L 29/78696
USPC ........................................................ 257/24
See application file for complete search history.

(56) References Cited

U.S. PATENT DOCUMENTS

| | | | |
|---|---|---|---|
| 9,972,537 B2 | 5/2018 | Jacob | |
| 2014/0197377 A1 | 7/2014 | Kim et al. | |
| 2017/0162654 A1* | 6/2017 | Maeda | .............. H01L 29/22 |
| 2020/0350215 A1* | 11/2020 | Zhang | ............. H01L 21/0262 |

* cited by examiner

*Primary Examiner* — Tong-Ho Kim
(74) *Attorney, Agent, or Firm* — Winston Hsu

(57) ABSTRACT

A method for fabricating a nanowire transistor includes the steps of first forming a nanowire channel structure on a substrate, in which the nanowire channel structure includes first semiconductor layers and second semiconductor layers alternately disposed over one another. Next, a gate structure is formed on the nanowire channel structure and then a source/drain structure is formed adjacent to the gate structure, in which the source/drain structure is made of graphene.

4 Claims, 5 Drawing Sheets

NANOWIRE TRANSISTOR AND METHOD FOR FABRICATING THE SAME

BACKGROUND OF THE INVENTION

1. Field of the Invention

The invention relates to a nanowire transistor and fabrication method thereof, and more particularly to a nanowire transistor using graphene as source/drain structure and/or contact plug and fabrication method thereof.

2. Description of the Prior Art

In the past four decades, semiconductor industries keep downscaling the size of MOSFETs in order to achieve the goals of high operation speed and high device density. However, the reduction of device size won't last forever. When transistor shrink into or below 30 nm regime, leakage current due to severe short channel effects and thin gate dielectric causes the increase of off-state power consumption, and consequently causes functionality failure. One-dimensional devices based on nanowires or nanotubes are considered the immediate successors to replace the traditional silicon technology with relatively low technological risk. Nanowire transistor, which has higher carrier mobility and can be further enhanced by quantum confinement effect, is one of the most promising devices. In addition, the control of gate to channel can also be improved by using high-k dielectric layers.

SUMMARY OF THE INVENTION

According to an embodiment of the present invention, a method for fabricating a nanowire transistor includes the steps of first forming a nanowire channel structure on a substrate, in which the nanowire channel structure includes first semiconductor layers and second semiconductor layers alternately disposed over one another. Next, a gate structure is formed on the nanowire channel structure and then a source/drain structure is formed adjacent to the gate structure, in which the source/drain structure is made of graphene.

According to another aspect of the present invention, a nanowire transistor includes a channel structure on a substrate, a gate structure on and around the channel structure, and a source/drain structure adjacent to two sides of the gate structure. Preferably, the source/drain structure is made of graphene.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
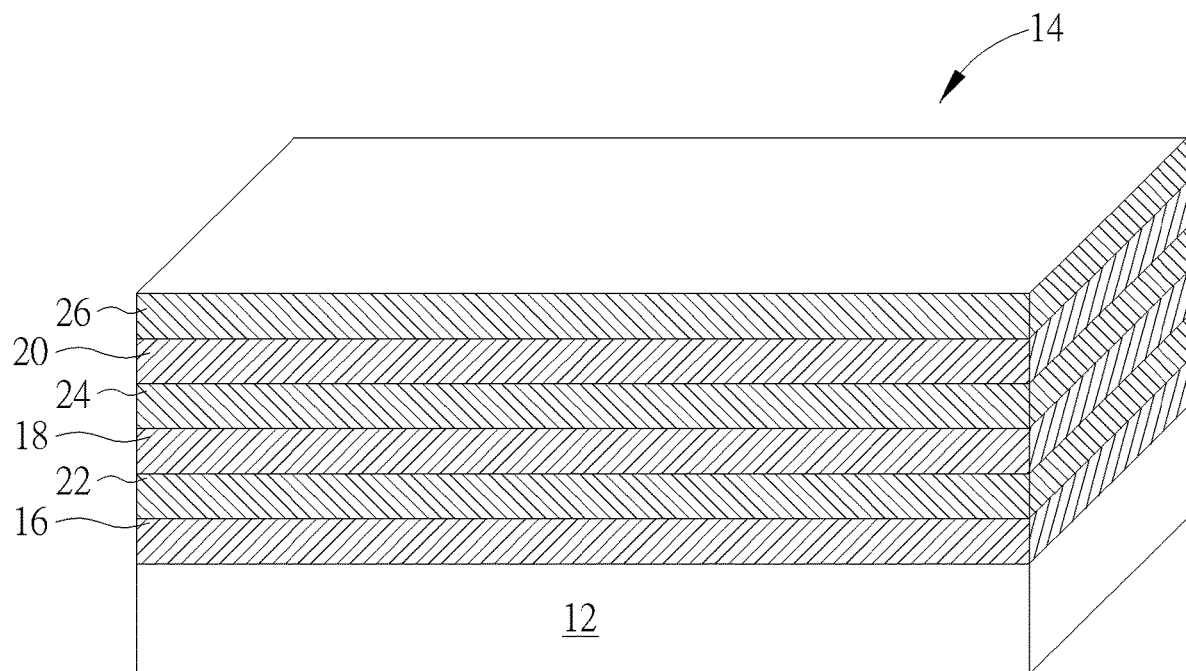
FIGS. 1-8 illustrate a method for fabricating a nanowire transistor according to an embodiment of the present invention.

Referring to FIGS. 1-8, FIGS. 1-8 illustrate a method for fabricating a nanowire transistor according to an embodiment of the present invention. As shown in FIG. 1, a substrate 12, such as a silicon substrate is provided, and a stack structure or channel structure 14 is formed on the substrate 12. In this embodiment, the channel structure 14 is preferably composed of a plurality of first semiconductor layers 16, 18, 20 and second semiconductor layers 22, 24, 26 stacked interchangeably or one over another. Preferably, the first semiconductor layers 16, 18, 20 and second semiconductor layers 22, 24, 26 are composed of different material or different lattice constant, in which the first semiconductor layers 16, 18, 20 and second semiconductor layers 22, 24, 26 could all be selected from the group consisting of silicon, germanium, doped silicon, doped germanium, and silicon germanium. It should be noted that even though three layers of first semiconductor layers 16, 18, 20 and three layers of second semiconductor layers 22, 24, 26 are disclosed in this embodiment, the quantity of the first semiconductor layers 16, 18, 20 and second semiconductor layers 22, 24, 26 are not limited to the ones disclosed in this embodiment, but could all be adjusted according to the demand of the product.

Figure 2:
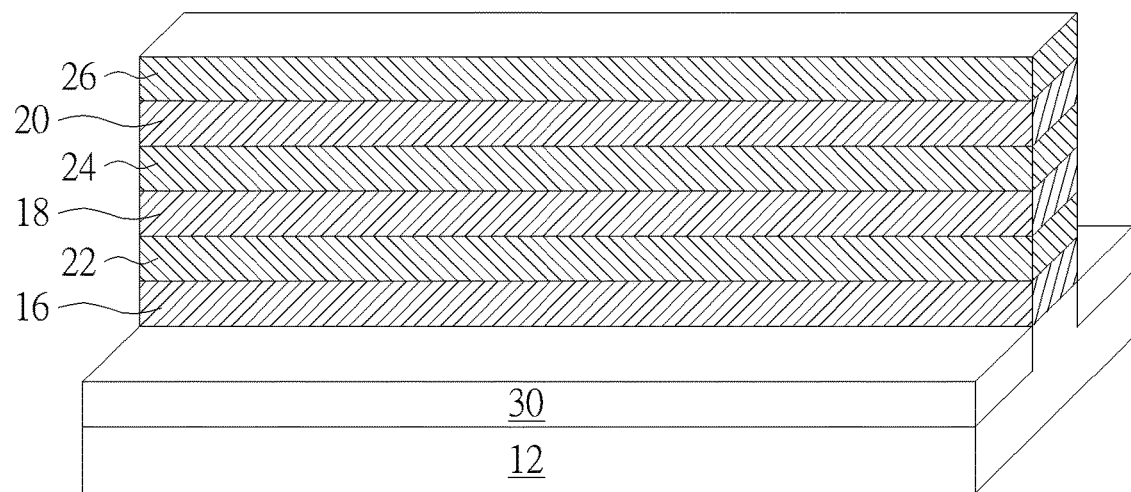

Next, as shown in FIG. 2, a photo-etching process is conducted by using a patterned resist (not shown) as mask to remove part of the channel structure 14 and part of the substrate 12 to form a recess (not shown) on the substrate 12. A dielectric layer 30 is then formed in the recess to electrically isolate the patterned channel structure 14, in which a top surface of the dielectric layer 30 is preferably even with the bottom surface of the first semiconductor layer 16 on the lowest level. In this embodiment, the dielectric layer 30 is composed of silicon oxide, but not limited thereto.

Figure 3:
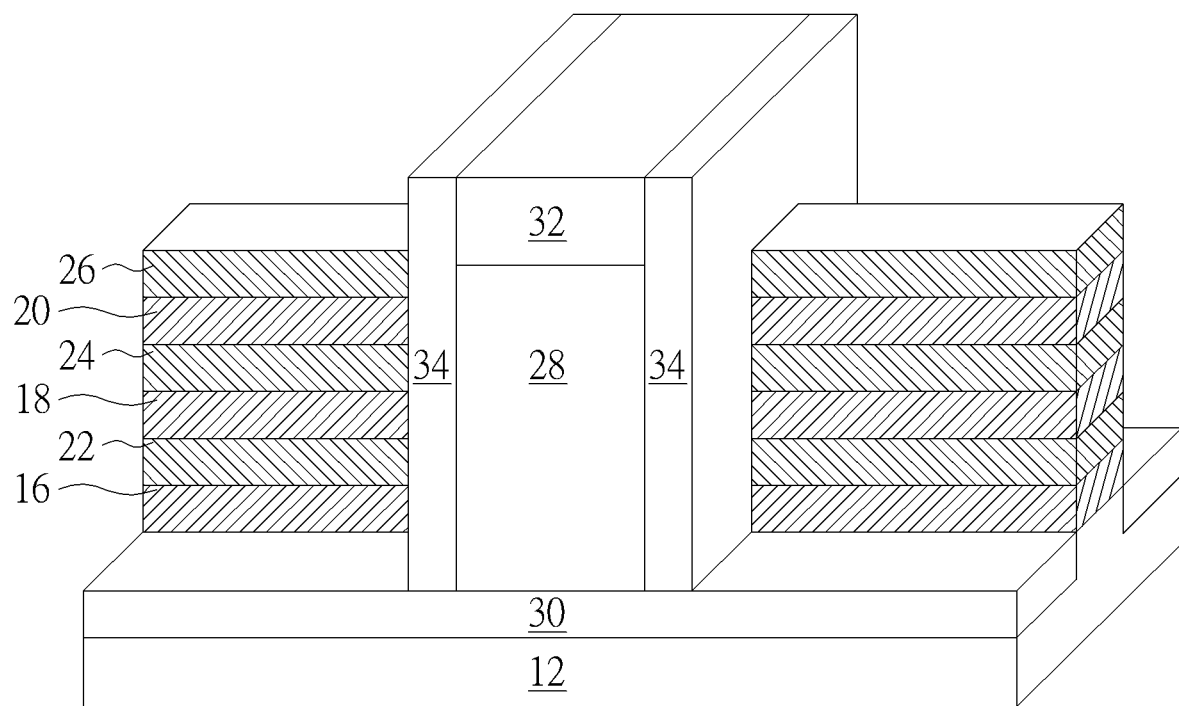

Next, as shown in FIG. 3, a gate structure 28 and a hard mask 32 or sacrificial gate structure are formed across the channel structure 14, and a spacer 34 is formed on the sidewalls of the gate structure 28 and the hard mask 32. In this embodiment, the gate structure 28 could be composed of polysilicon, the hard mask 32 could include silicon nitride, and the spacer 34 could be selected from the group consisting of $SiO_2$, SiN, SiON, and SiCN, but not limited thereto. It should be noted that even though the spacer 34 in this embodiment is a single layered spacer, it would also be desirable to form a composite spacer according to the demand of the product. For instance, the spacer 34 could also be made of one or more spacers, in which the composite spacers could be made of same or different material. According to an embodiment of the present invention, a composite spacer could include a dual-layer spacer composed of both $SiO_2$ and SiN, or a triple-layer spacer composed of oxide-nitride-oxide, which are all within the scope of the present invention.

Figure 4:
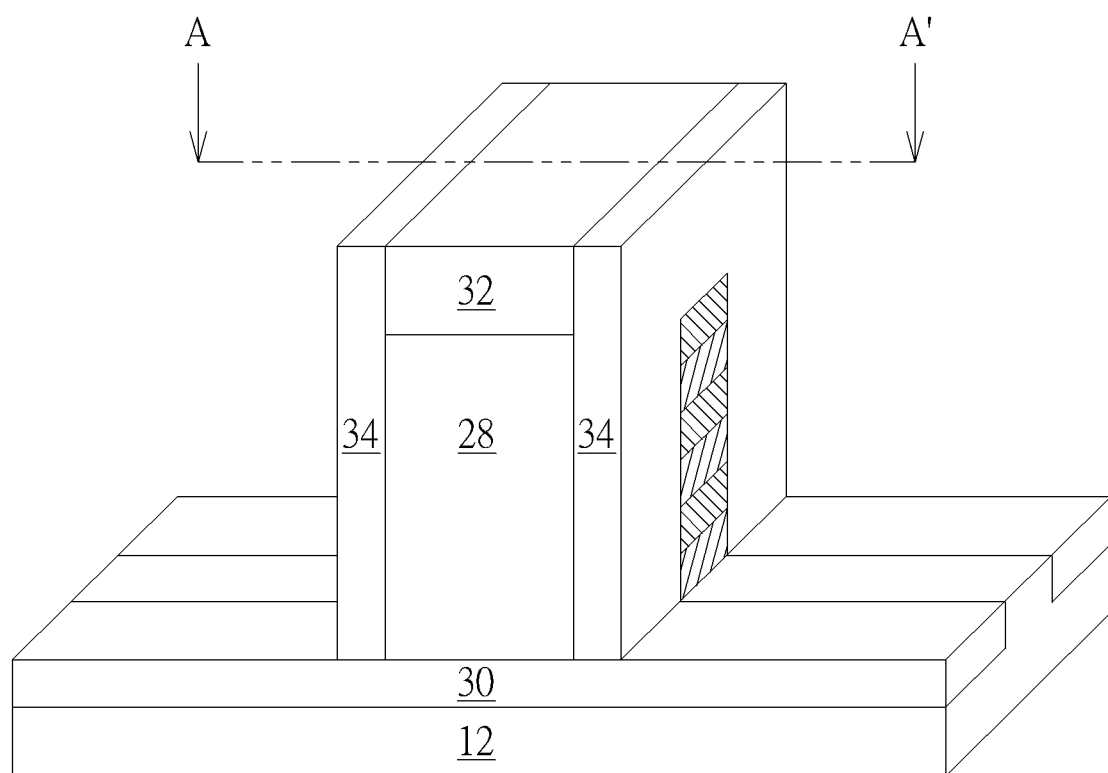
Figure 5:
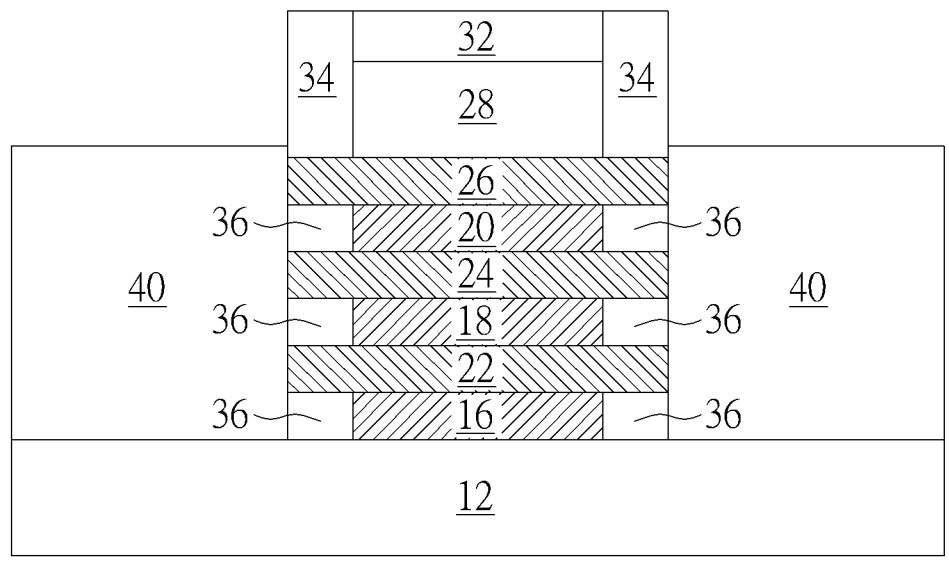

Next, referring to FIGS. 4-5, in which FIG. 5 illustrates a cross-sectional view of FIG. 4 along the sectional line AA'. As shown in FIGS. 4-5, a photo-etching process is then conducted or using the hard mask 32 directly as mask to remove part of the channel structure 14 adjacent to two sides of the spacer 34 for forming recesses (not shown). Next, the hard mask 32 and part of the first semiconductor layers 16, 18, 20 are removed and another spacer 36 is formed adjacent to the first semiconductor layers 16, 18, 20, in which the sidewalls of the spacer 36 are aligned with sidewalls of the second semiconductor layers 22, 24, 26 and sidewalls of the spacer 34 on top. In this embodiment, the spacers 34 and 36 could be made of same or different materials including but not limited to for example $SiO_2$ and/or SiN, which are all within the scope of the present invention.

Next, a source/drain structure 40 is formed adjacent to two sides of the spacer 36 on the substrate 12, in which the source/drain structure 40 is preferably made of graphene. In this embodiment, the formation of the source/drain structure 40 could be accomplished by first conducting an epitaxial growth process to form epitaxial layers made of silicon carbide on the substrate 12 adjacent two sides of the spacer 36, and then conducting a thermal anneal process by using temperature between 700-800° C. to thermally decompose or sublimate silicon atoms in the epitaxial layers for forming the source/drain structure 40 made of graphene.

Figure 6:
Figure 6:
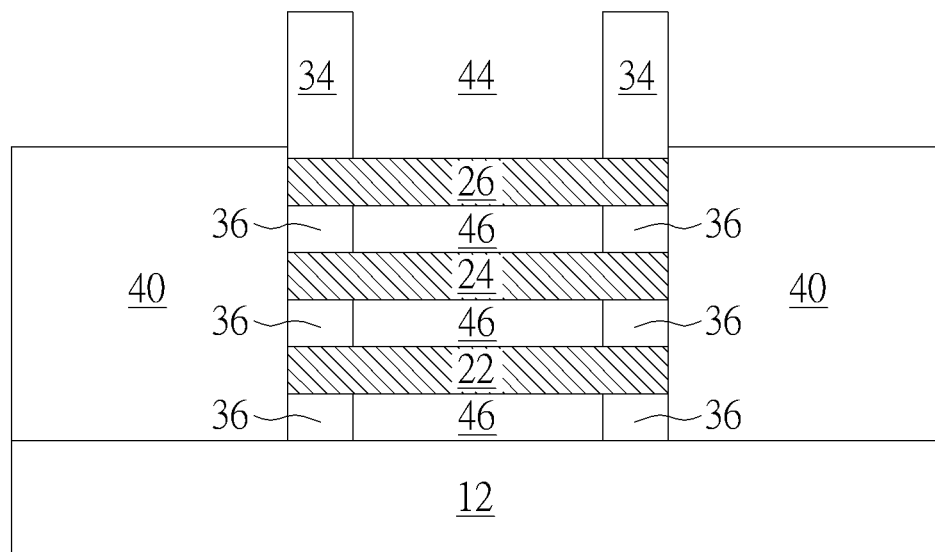

Next, as shown in FIG. 6, an etching process is conducted to remove the hard mask 32 and the gate structure 28 for forming a recess 44, and another selective etching process is conducted to remove the first semiconductor layers 16, 18, 20 for forming recesses 46. Since the first semiconductor layers 16, 18, 20 and the second semiconductor layers 22, 24, 26 are made of different material and a predetermined etching selectivity is found between the two semiconductor layers, it would be desirable to remove the first semiconductor layers 16, 18, 20 without damaging any of the second semiconductor layers 22, 24, 26 during the etching process.

According to an embodiment of the present invention, the first semiconductor layers 16, 18, 20 and the gate structure 28 could also be made of same material. For instance, both the first semiconductor layers 16, 18, 20 and the gate structure 28 could be made of polysilicon while the second semiconductor layers 22, 24, 26 is selected from the group consisting of silicon, germanium, doped silicon, doped germanium, and silicon germanium, and in such instance, only one single etching process is required to remove the hard mask 32 and the first semiconductor layers 16, 18, 20 at the same time, which is also within the scope of the present invention. It should be noted that after removing the first semiconductor layers 16, 18, 20 through etching process, it would be desirable to selectively use an oxidation process or another etching process to remove part of the second semiconductor layers 22, 24, 26 so that the original cubic second semiconductor layers 22, 24, 26 are transformed into cylindrical nanowire channel layers, which is also within the scope of the present invention.

Figure 7:
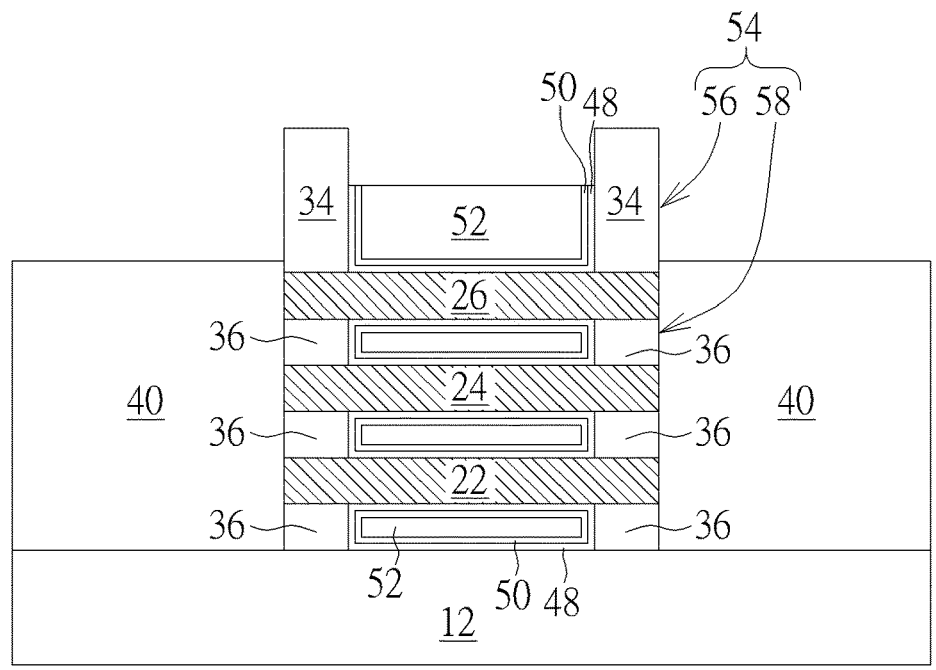

Next, as shown in FIG. 7, a high-k dielectric layer 48, a work function metal layer 50, and a low resistance metal layer 52 are formed in the recess 44 and recesses 46, and a planarizing process is conducted thereafter to form a gate structure 54. In this embodiment, the gate structure 54 preferably includes two parts, in which a first portion 56 is formed directly above the second semiconductor layers 22, 24, 26 while second portions 58 are formed in staggered arrangement or one over another with the second semiconductor layers 22, 24, 26. Preferably, each of the first portion 56 and the second portions 58 are made of the high-k dielectric layer 48, the work function metal layer 50, and the low resistance metal layer 52. Viewing from another perspective, the high-k dielectric layer 48 and the work function metal layer 50 are formed to wrap around the second semiconductor layers 22, 24, 26 while the low resistance metal layer 52 is formed to fill the recesses 44 and 46.

In this embodiment, the high-k dielectric layer 48 is preferably selected from dielectric materials having dielectric constant (k value) larger than 4. For instance, the high-k dielectric layer 48 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 50 is formed for tuning the work function of the later formed metal gates to be appropriate in an NMOS or a PMOS. For an NMOS transistor, the work function metal layer 50 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 50 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 50 and the low resistance metal layer 52, in which the material of the barrier layer may include titanium (Ti), titanium nitride (TiN), tantalum (Ta) or tantalum nitride (TaN). Furthermore, the material of the low-resistance metal layer 52 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity. Next, part of the high-k dielectric layer 48, part of the work function metal layer 50, and part of the low resistance metal layer 52 are removed to form a recess (not shown)

Figure 8:
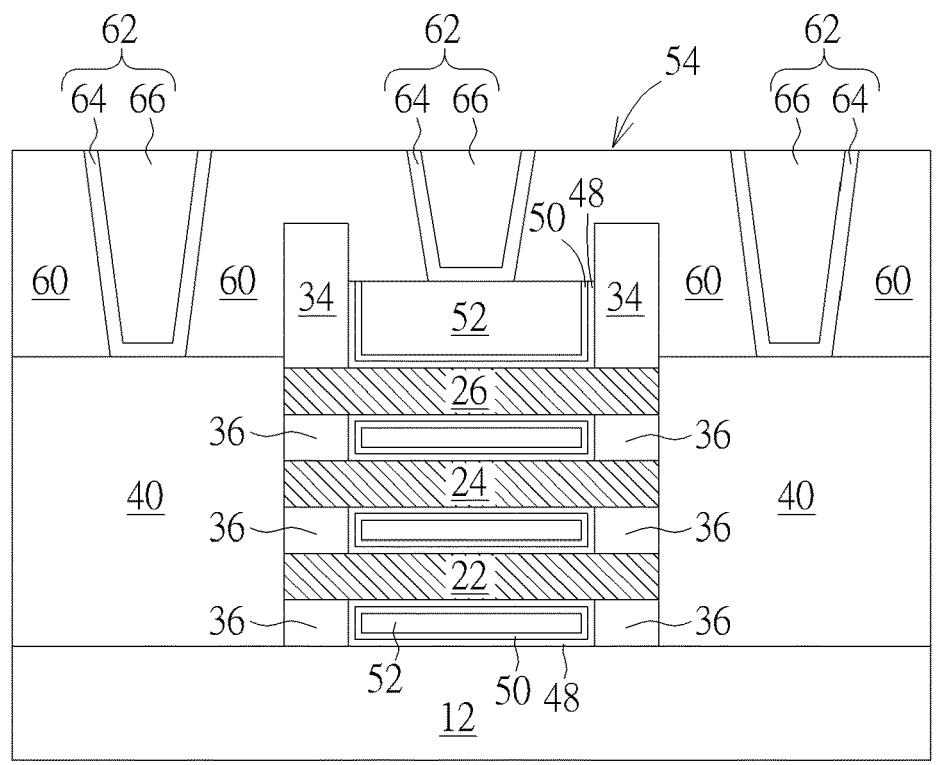

Next, as shown in FIG. 8, an inter-layer dielectric (ILD) layer 60 is formed on the source/drain structure 40 to fill the recess. Preferably, the ILD layer 60 could be made of any insulating material containing oxides such as an oxide layer made of tetraethyl orthosilicate (TEOS), but not limited thereto. Next, a contact plug formation process is conducted to form contact plugs 62 electrically connected to the source/drain structure 40. In this embodiment, the formation of the contact plugs 62 could be accomplished by using an etching process to remove part of the ILD layer 60 for forming contact holes (not shown) exposing the surface of source/drain structure 40. Next, a barrier layer 64 and a metal layer 66 are deposited to fill the contact holes completely, and a planarizing process such as chemical mechanical polishing (CMP) is conducted to remove part of the metal layer 66 and part of the barrier layer 64 for forming contact plugs 62 in the contact holes, in which the top surface of the contact plugs 62 is even with the top surface of the ILD layer 60. In this embodiment, the barrier layer 64 is selected from the group consisting of Ti, Ta, TiN, TaN, and WN and the metal layer 66 is selected from the group consisting of Al, Ti, Ta, W, Nb, Mo, and Cu, but not limited thereto. This completes the fabrication of a semiconductor device according to an embodiment of the present invention.

Figure 9:
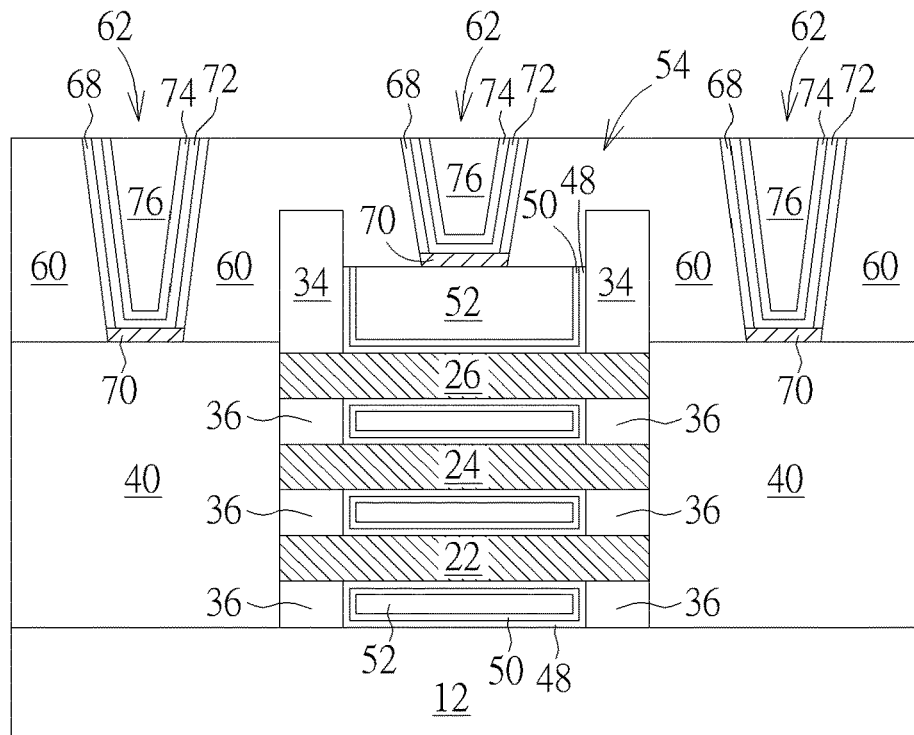
FIG. 9 illustrates a structural view of a nanowire transistor according to an embodiment of the present invention.

Referring to FIG. 9, FIG. 9 illustrates a structural view of a nanowire transistor according to an embodiment of the present invention. As shown in FIG. 9, in contrast to the aforementioned embodiment of immediately forming a barrier layer 64 and metal layer 66 in the contact holes to form the contact plugs 62 after contact holes are formed, it would also be desirable to first deposit a first barrier layer 68 into the contact holes, in which the first barrier layer 68 is conformally formed on the surface of the source/drain structure 40 and inner sidewalls of the contact holes. Preferably, the first metal layer 88 is selected from the group consisting of Ti, Co, Ni, and Pt, and most preferably Ti.

Next, a first thermal treatment process and a second thermal treatment process are conducted sequentially to form a silicide layer 70 on the surface of the source/drain structure 40. In this embodiment, the first thermal treatment process includes a soak anneal process, in which the temperature of the first thermal treatment process is preferably between 500° C. to 600° C., and most preferably at 550° C., and the duration of the first thermal treatment process is preferably between 10 seconds to 60 seconds and most preferably at 30 seconds. The second thermal treatment process includes a spike anneal process, in which the temperature of the second thermal treatment process is preferably between 600° C. to 950° C. and most preferably at 600° C., and the duration of the second thermal treatment process is preferably between 100 milliseconds to 5 seconds, and most preferably at 5 seconds.

Next, a graphene layer 72 could be formed on the surfaces of the silicide layer 70 and the first barrier layer 68, and then a selective second barrier layer 74 and a metal layer 76 are formed on the graphene layer 72 to fill the contact holes completely. Preferably, the second barrier layer 74 is made of metal compounds including but not limited to for example TiN or TaN and the metal layer 76 is made of tungsten (W). Next, a planarizing process such as CMP is conducted to remove part of the metal layer 76, part of the second barrier layer 74, part of the graphene layer 72, part of the first barrier layer 68, and even part of the ILD layer 60 to form contact plugs 62 electrically connecting the source/drain structure 40. Preferably, the source/drain structure 40 in this embodiment could be made of graphene or epitaxial layers such as silicon germanium.

Figure 10:
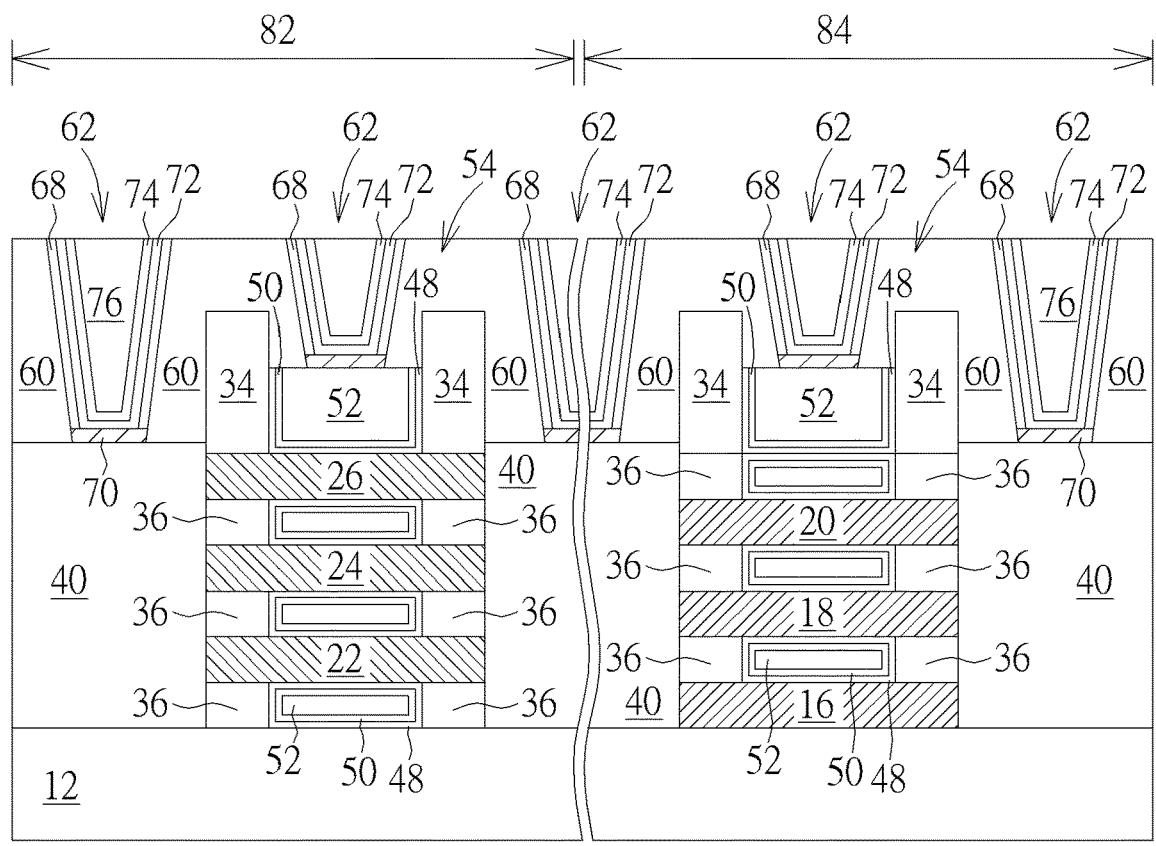
FIG. 10 illustrates a structural view of a CMOS nanowire transistor according to an embodiment of the present invention.

Referring to FIG. 10, FIG. 10 illustrates a structural view of a CNMOS nanowire transistor according to an embodiment of the present invention. As shown in FIG. 10, in contrast to the aforementioned embodiment of fabricating transistor having only one conductive type, it would also be desirable to employ the approach of using graphene for forming the source/drain structure 40 as shown in FIG. 8 or the approach of using graphene for forming both the source/drain structure 40 and contact plugs 62 as shown in FIG. 9 for fabricating a CMOS transistor device. For instance, it would be desirable to first define a NMOS region 82 and a PMOS region 84 on the substrate 12, and then carry out the fabrication processes conducted in FIGS. 1-8 for fabricating source/drain structures 40 and/or contact plugs 62 made of graphene on the NMOS region 82 and PMOS region 84 respectively.

It should be noted that in contrast to the final channel structure of the nanowire transistor from the aforementioned embodiment could be selected from the group consisting of silicon, germanium, doped silicon, doped germanium, and silicon germanium, it would be desirable to first remove the first semiconductor layers 16, 18, 20 on the NMOS region 82 and the second semiconductor layers 22, 24, 26 on the PMOS region 84 while keeping the second semiconductor layers 22, 24, 26 on the NMOS region 82 and first semiconductor layers 16, 18, 20 on the PMOS region 84 to serve as channel structures 14 for each NMOS region 82 and PMOS region 84 before the formation of work function metal layers. In other words, the channel structure 14 on the NMOS region 82 and the channel structure 84 are preferably made of different materials. For instance, the channel structure 14 on the NMOS region 82 preferably includes silicon while the channel structure 14 on the PMOS region 84 includes silicon germanium.

Overall, the present invention preferably forms source/drain structures and/or contact plugs made of graphene during fabrication of a nanowire transistor. By using the zero bandgap property of graphene, the present invention is able effective reduce resistance between source/drain structures and contact plugs thereby boosting the performance of the device significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A nanowire transistor, comprising:
   a channel structure on a substrate;
   a gate structure on and around the channel structure;
   a source/drain structure adjacent to two sides of the gate structure;
   an interlayer dielectric (ILD) layer around the gate structure; and
   a contact plug in the ILD layer to electrically connect the source/drain structure, wherein the contact plug comprises grapheme and the contact plug further comprises:
      a silicide layer on the source/drain structure;
      a graphene layer on the silicide layer;
      a barrier layer on the graphene layer; and
      a metal layer on the barrier layer.

2. The nanowire transistor of claim 1, wherein the source/drain structure comprises an epitaxial layer.

3. The nanowire transistor of claim 1, wherein the channel structure is selected from the group consisting of silicon, germanium, doped silicon, doped germanium, and silicon germanium.

4. The nanowire transistor of claim 1, further comprising a spacer adjacent to the gate structure, wherein a sidewall of the spacer is aligned with a sidewall of the channel structure.

* * * * *